US009524895B2

(12) United States Patent
Hara et al.

(10) Patent No.: US 9,524,895 B2
(45) Date of Patent: Dec. 20, 2016

(54) SUBSTRATE TRANSFER ANTECHAMBER MECHANISM

(71) Applicant: NATIONAL INSTITUTE OF ADVANCED INDUSTRIAL SCIENCE AND TECHNOLOGY, Tokyo (JP)

(72) Inventors: Shiro Hara, Tsukuba (JP); Hitoshi Maekawa, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/647,685

(22) PCT Filed: Oct. 29, 2013

(86) PCT No.: PCT/JP2013/079225
§ 371 (c)(1),
(2) Date: May 27, 2015

(87) PCT Pub. No.: WO2014/087760
PCT Pub. Date: Jun. 12, 2014

(65) Prior Publication Data
US 2015/0311101 A1 Oct. 29, 2015

(30) Foreign Application Priority Data

Dec. 4, 2012 (JP) ................................. 2012-265071

(51) Int. Cl.
*H01L 21/677* (2006.01)
*B25J 18/02* (2006.01)
*B25J 9/00* (2006.01)

(52) U.S. Cl.
CPC ........ *H01L 21/67742* (2013.01); *B25J 9/0027* (2013.01); *B25J 18/02* (2013.01);
(Continued)

(58) Field of Classification Search
CPC ......... B25J 18/02; B25J 18/025; B25J 9/0021; B25J 9/0027; H01L 21/67748; H01L 21/67751
See application file for complete search history.

(56) References Cited

U.S. PATENT DOCUMENTS 4,532,970 A    8/1985  Tullis et al.
4,674,939 A    6/1987  Maney et al.
(Continued)

FOREIGN PATENT DOCUMENTS

| JP | H11-054400 A | 2/1999 |
| JP | 2001-284433 A | 10/2001 |
| JP | 2001-284433 A * | 10/2001 |
| JP | 2003-174072 | 6/2003 |
| JP | 2004-537867 A | 12/2004 |
| WO | 03/013993 | 2/2003 |

OTHER PUBLICATIONS

International Search Report mailed on Dec. 10, 2013 in corresponding International Patent Application No. PCT/JP2013/079225.

*Primary Examiner* — Gerald McClain
(74) *Attorney, Agent, or Firm* — Staas & Halsey LLP

(57) ABSTRACT

There is provided a substrate transfer antechamber mechanism for a compact manufacturing apparatus that produces various types of devices in small volume using a small-diameter processing substrate at low cost. A container placement table, on which a wafer transfer container housing a semiconductor wafer is placed, is provided on an upper surface of an apparatus antechamber for a compact semiconductor manufacturing apparatus, and the apparatus antechamber includes therein a wafer elevating mechanism and a horizontal transfer mechanism. The wafer elevating mechanism moves down while holding from below a deliv- (Continued)

ery bottom of the wafer transfer container, on which the semiconductor wafer remains placed, to transfer the semiconductor wafer into the apparatus antechamber. The horizontal transfer mechanism transfers the semiconductor wafer into a processing chamber using a transfer arm that receives the semiconductor wafer from the delivery bottom and extends.

7 Claims, 14 Drawing Sheets

(52) U.S. Cl.
CPC .. *H01L 21/67745* (2013.01); *H01L 21/67748* (2013.01); *H01L 21/67772* (2013.01); *H01L 21/67778* (2013.01)

(56) References Cited

U.S. PATENT DOCUMENTS

| | | | | |
|---|---|---|---|---|
| 4,770,590 | A | * | 9/1988 | Hugues ............. H01L 21/67778 414/789.9 |
| 6,536,136 | B2 | * | 3/2003 | Saga ................. H01L 21/67772 414/939 |
| 2001/0026747 | A1 | | 10/2001 | Saga |
| 2001/0041122 | A1 | * | 11/2001 | Kroeker ............ H01L 21/67751 414/744.2 |
| 2009/0326703 | A1 | * | 12/2009 | Presley ............. H01L 21/67748 700/112 |
| 2015/0321347 | A1 | * | 11/2015 | Hirota ..................... B25J 18/02 414/744.5 |

\* cited by examiner

SUBSTRATE TRANSFER ANTECHAMBER MECHANISM

CROSS REFERENCE TO RELATED APPLICATIONS

This application is a U.S. National Stage application, which claims the benefit under 35 U.S.C. §371, of PCT International Patent Application No. PCT/JP2013/079225, filed Oct. 29, 2013, which is based on and claims the foreign priority benefit of Japanese Patent Application No. 2012-265071, filed Dec. 4, 2012, the entire disclosures of which are herein incorporated by reference as a part of this application.

TECHNICAL FIELD

The present invention relates to a substrate transfer antechamber mechanism provided in a compact manufacturing apparatus used in a process of manufacturing a device (a semiconductor device, or the like) using a small-diameter processing substrate (for example, a semiconductor wafer, or the like).

BACKGROUND ART

A conventional manufacturing apparatus will be described taking an apparatus used for a semiconductor manufacturing process, that is, a semiconductor manufacturing apparatus as an example.

The conventional semiconductor manufacturing apparatus is intended to manufacture a few types of semiconductor devices in large volume. In order to manufacture the same type of semiconductor devices in large volume at low cost, a large-diameter semiconductor wafer is desirably used. Using the large-diameter semiconductor wafer allows many semiconductor devices to be simultaneously manufactured, which facilitates manufacturing the same type of semiconductor devices in large volume, or reducing a manufacturing cost for one chip. For this reason, a conventional semiconductor manufacturing process used a very large manufacturing apparatus. Thus, a semiconductor manufacturing factory was huge, and construction and management of the factory was expensive.

In a general semiconductor manufacturing process, a sealed wafer transfer container is used in transferring a semiconductor wafer between processing apparatuses. The wafer transfer container, while housing a semiconductor wafer, is set in an antechamber of the processing apparatus. Then, the semiconductor wafer is transferred into the antechamber of a semiconductor manufacturing apparatus. Subsequently, the semiconductor wafer is transferred from the antechamber into a processing chamber, and subjected to desired deposition processing, machining processing, test processing, or the like. Then, the semiconductor wafer is transferred through the antechamber to the wafer transfer container and again housed therein.

In order to ensure sufficient yield of a semiconductor device, there is a need to prevent a semiconductor wafer from being contaminated with fine particles in a step of transferring the semiconductor wafer from the wafer transfer container through the antechamber to the processing chamber, or a step of returning the semiconductor wafer from the processing chamber through the antechamber to the wafer transfer container. As technologies for preventing such contamination, for example, technologies disclosed in the following Patent Literatures U.S. Pat. No. 4,532,970 and U.S. Pat. No. 4,674,939 are known.

SUMMARY OF INVENTION

Technical Problem

In recent years, there is an increasing desire for production of various types of semiconductor devices in small volume. Also, for producing a sample of a semiconductor device in research and development, or the like, it is desired to manufacture one or a few semiconductor devices. To meet such needs, a technology is desired for manufacturing a semiconductor device using a small-diameter semiconductor wafer at low cost.

Also, as described above, in manufacturing the same type of products in large volume in a large-scale factory, adjusting a production amount in response to demand fluctuation of a market is extremely difficult. This is because production in small volume cannot ensure profits in line with management cost of the factory. Further, the semiconductor manufacturing factory requires high construction investment and management cost, and thus it is difficult for medium and small businesses to move into the market.

For the above reasons, a technology is desired for producing various types of semiconductor devices in small volume using a small-diameter semiconductor wafer or a compact manufacturing apparatus in a small-scale manufacturing factory.

However, a semiconductor manufacturing apparatus using the technologies disclosed in Patent Literatures 1 and 2 above includes a large antechamber, which is unsuitable for a compact manufacturing apparatus.

For a semiconductor manufacturing apparatus in which a wafer transferring robot is of a scalar type (articulated horizontal type), bendable articulations occupy a large area in a horizontal surface. Thus, an area of a antechamber, and an area of an opening between the antechamber and a processing chamber has to be further increased.

Such problems occur in the semiconductor manufacturing apparatus, and also, for example, an apparatus for manufacturing an electronic device by processing a sapphire substrate or an aluminum substrate, or an apparatus for manufacturing an optical device.

The present invention has an object to provide a substrate transfer antechamber mechanism for a compact manufacturing apparatus that produces various types of devices in small volume using a small-diameter processing substrate at low cost.

Solution to Problem

The present invention provides a substrate transfer antechamber mechanism for a compact manufacturing apparatus including a processing chamber that performs desired processing of a processing substrate and an apparatus antechamber that transfers the processing substrate into and out of the processing chamber; the mechanism comprising: a container placement table provided on an upper surface of the apparatus antechamber to set a substrate transfer container housing the processing substrate; a substrate elevating mechanism provided in the apparatus antechamber, which moves down while holding from below a delivery bottom of the substrate transfer container, on which the processing substrate remains placed, to transfer the processing substrate into the apparatus antechamber; and a horizontal transfer mechanism provided in the apparatus antechamber to transfer the processing substrate into the processing chamber using a transfer arm that receives the processing substrate from the delivery bottom and extends in a horizontal direction.

The substrate transfer antechamber mechanism according to the present invention is desirably configured so that the processing chamber is separable from the apparatus antechamber.

The substrate transfer antechamber mechanism according to the present invention desirably further includes a transfer arm elevating mechanism provided in the apparatus antechamber to move the horizontal transfer mechanism down to place the processing substrate on the substrate placement table in the processing chamber.

The substrate transfer antechamber mechanism according to the present invention is suitably applied when the processing substrate is a wafer having a diameter of 20 millimeter or less.

Advantageous Effects of Invention

According to the present invention, the substrate elevating mechanism is used to transfer the processing substrate from the container placement table provided on the upper surface into the apparatus antechamber, and then the horizontal transfer mechanism is used to transfer the processing substrate in the horizontal direction into the processing chamber, which can provide a compact apparatus antechamber.

Also, in the present invention, the processing chamber is separable from the apparatus antechamber, which can increase versatility of the apparatus antechamber and reduce manufacturing cost of the compact manufacturing apparatus.

Also, in the present invention, the transfer arm elevating mechanism is provided, which can move the horizontal transfer mechanism down to place the processing substrate on the substrate placement table in the processing chamber.

Also, in the present invention, the processing substrate is a wafer having a diameter of 20 mm or less, which can easily reduce a size and cost of the apparatus antechamber.

DESCRIPTION OF EMBODIMENT

Embodiment 1

Now, Embodiment 1 of the present invention will be described taking a case where the present invention is applied to a substrate transfer antechamber mechanism for a semiconductor manufacturing apparatus as an example.

Figure 1:
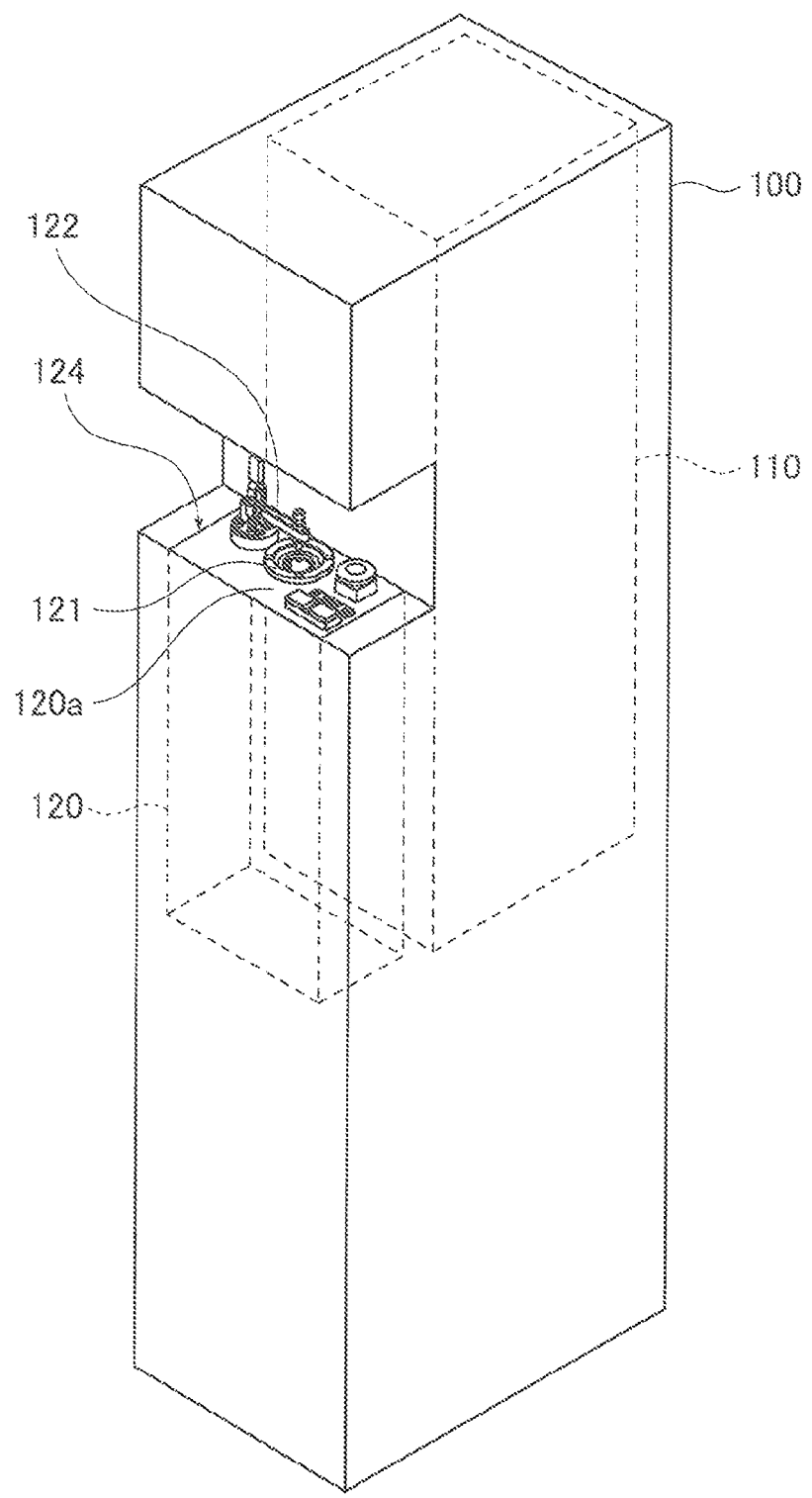
FIG. 1 is a conceptual perspective view of an overall configuration of a compact manufacturing apparatus according to Embodiment 1 of the present invention.
Figure 2:
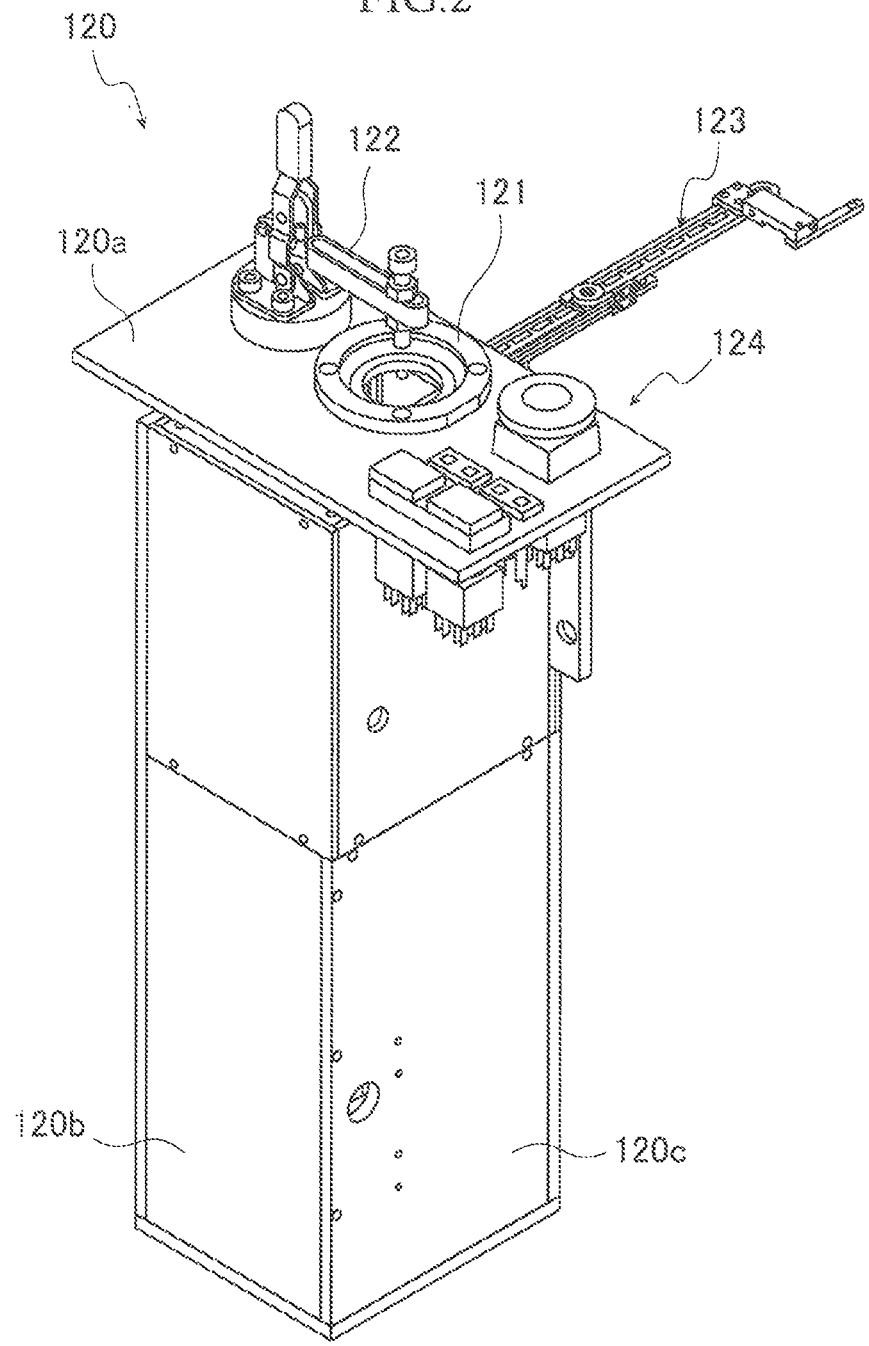
FIG. 2 is a schematic perspective view of an external appearance of a structure of an apparatus antechamber according to Embodiment 1 of the present invention.
Figure 3:
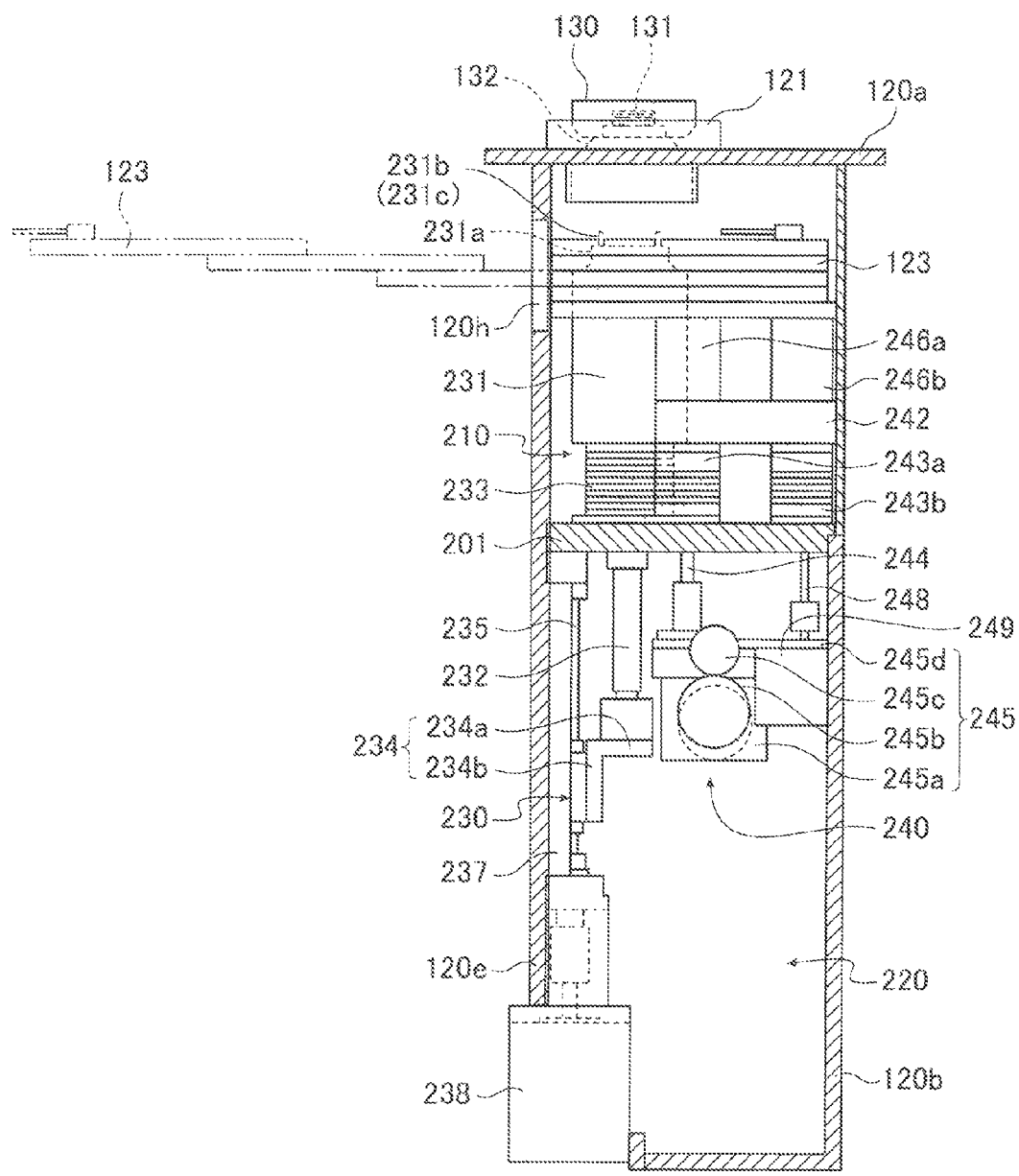
FIG. 3 is a schematic left side view of an overall internal structure of the apparatus antechamber according to Embodiment 1 of the present invention.
Figure 4:
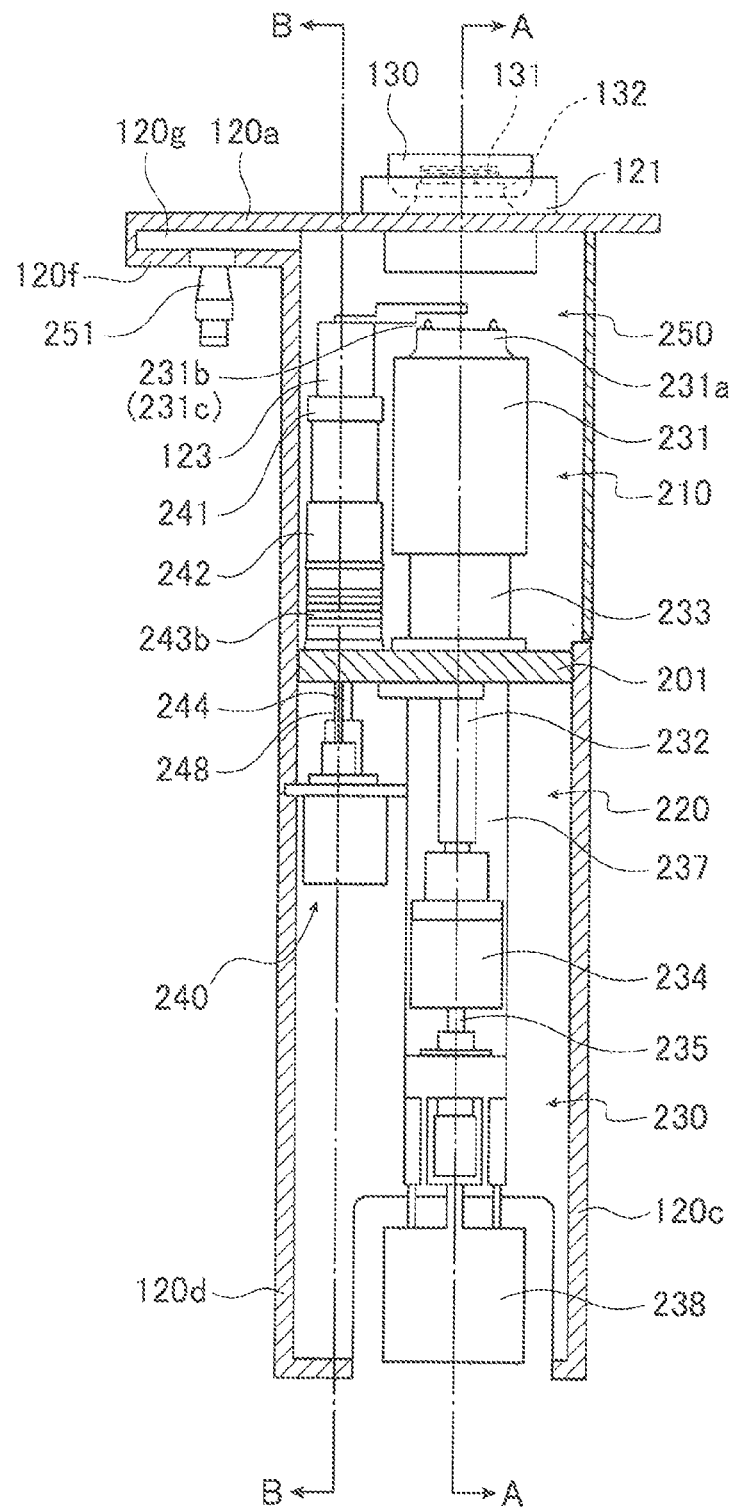
FIG. 4 is a schematic front view of the overall internal structure of the apparatus antechamber according to Embodiment 1 of the present invention.
Figure 5:
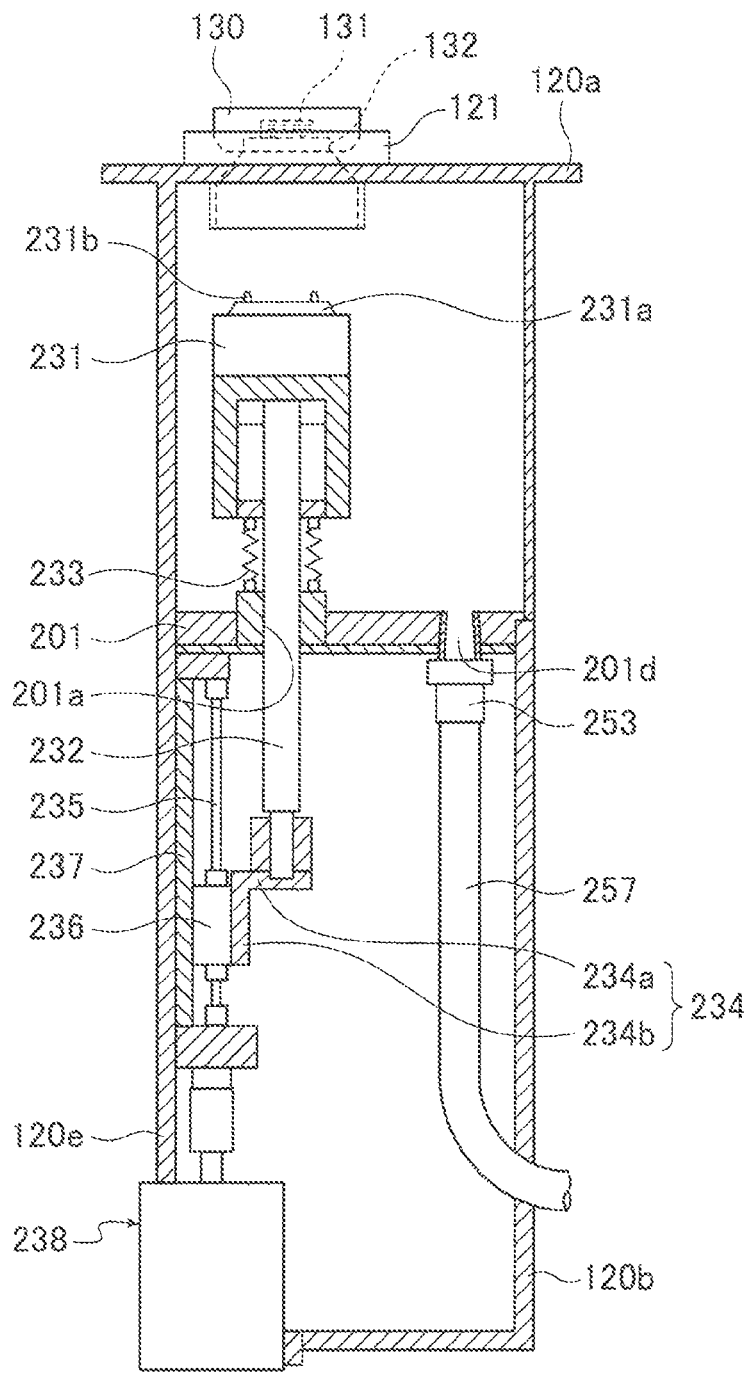
FIG. 5 is an A-A sectional view of FIG. 4 according to Embodiment 1 of the present invention.
Figure 6:
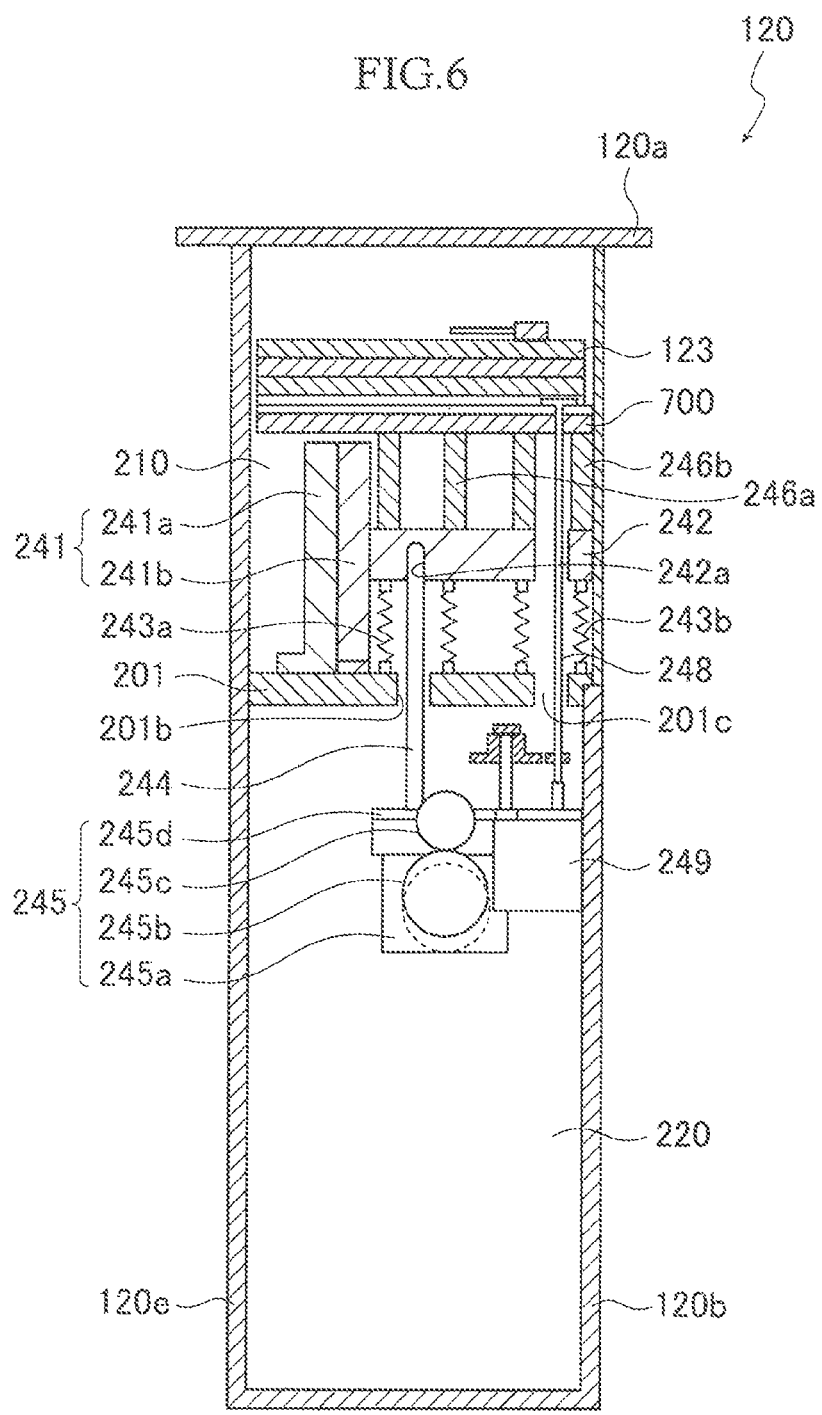
FIG. 6 is a B-B sectional view of FIG. 4 according to Embodiment 1 of the present invention.

FIG. 1 is a conceptual perspective view of an overall configuration of a compact semiconductor manufacturing apparatus according to Embodiment 1. FIG. 2 is a schematic perspective view of an external appearance of a structure of an apparatus antechamber 120. FIGS. 3 to 6 are conceptual views of an internal structure of the apparatus antechamber 120, and FIG. 3 is a left side view, FIG. 4 is a front view, FIG. 5 is an A-A sectional view of FIG. 4, and FIG. 6 is a B-B sectional view of FIG. 4.

As is apparent from FIG. 1, a compact semiconductor manufacturing apparatus 100 according to Embodiment 1 includes a processing chamber 110, and an apparatus antechamber 120 as an antechamber. The processing chamber 110 is separable from the apparatus antechamber 120. This allows the apparatus antechamber 120 to be shared by various types of processing chambers 110, and thus can reduce overall manufacturing cost for the compact semiconductor manufacturing apparatus.

The processing chamber 110 receives a semiconductor wafer 131 (see FIGS. 3 to 5) from the apparatus antechamber 120 through a wafer transfer port (not shown). Then, the processing chamber 110 performs known processings (that is, deposition, etching, test processings, or the like) of the semiconductor wafer 131. Detailed descriptions of the processing chamber 110 are omitted. In Embodiment 1, a small-diameter semiconductor wafer 131 having a diameter of 20 millimeter or less (for example, 12.5±0.2 millimeter) is used.

The apparatus antechamber 120 is a chamber for taking out the semiconductor wafer 131 housed in a wafer transfer container 130 and transferring the semiconductor wafer 131 to the processing chamber 110.

The apparatus antechamber 120 has a casing constituted by a top plate 120a, side plates 120b to 120e and other panels made of metal or the like, the top plate 120a protrudes from the side plate 120d, and a back plate 120f is provided on a back side of the protruding portion (see FIG. 4). A clearance between the top plate 120a and the back plate 120f forms an air supply passage 120g for introducing air from outside into the apparatus antechamber 120 (details will be described later).

On the top plate 120a of the apparatus antechamber 120, a container placement table 121 (see FIG. 3) on which the wafer transfer container 130 is placed, and a pressing lever 122 (see FIG. 2) that presses and secures the placed wafer transfer container 130 from above is provided. As described later, the semiconductor wafer 131 having transferred from the wafer transfer container 130 into the apparatus antechamber 120 is transferred through a transfer port 120h (see FIG. 3) to the processing chamber 110 using a transfer arm 123. In addition, on the top plate 120a of the apparatus antechamber 120, an operation button 124 or the like for operating the compact semiconductor manufacturing apparatus 100 is provided.

As shown in FIGS. 3 to 6, the apparatus antechamber 120 is airtightly divided, by a partition plate 201, into a clean chamber 210 into and out of which the semiconductor wafer 131 is transferred, and a drive chamber 220 that houses motor mechanisms 238, 245, 249 described later.

The apparatus antechamber 120 also includes a wafer elevating mechanism 230 that transfers the semiconductor wafer 131 into and out of the wafer transfer container 130 set on the container placement table 121, and a horizontal transfer mechanism 240 that transfers the semiconductor wafer 131 into and out of the processing chamber 110 using the transfer arm 123.

First, with reference to FIGS. 3 to 5, a structure of the wafer elevating mechanism 230 will be described.

The wafer elevating mechanism 230 includes a substantially cylindrical elevator 231 on which the semiconductor wafer 131 is placed. A placement portion 231a having a reduced diameter is formed on an upper surface of the elevator 231. On an upper surface of the placement portion 231a, for example, three protrusions 231b are provided. A delivery bottom 132 of the wafer transfer container 130, on which the semiconductor wafer 131 remains placed, is held on the protrusions 231b (details will be described later). As shown in FIG. 5, the elevator 231 is supported by an elevating shaft 232 so as to be movable up and down.

The elevating shaft 232 is coupled and secured to a central portion of a lower surface of the elevator 231 through an opening hole 201a in the partition plate 201 and wafer elevating bellows 233 (details will be described later), and supports the elevator 231 (see FIG. 5).

The wafer elevating bellows 233 is provided to maintain airtightness between the clean chamber 210 and the drive chamber 220. An upper end of the wafer elevating bellows 233 is airtightly secured to a peripheral edge of the lower surface of the elevator 231. A lower end of the wafer elevating bellows 233 is airtightly secured to an upper surface of the partition plate 201 so as to surround an outer edge of the opening hole 201a. The wafer elevating bellows 233 vertically expands and contracts as the elevator 231 moves up and down.

The elevating shaft 232 is supported by a substantially hook-shaped support member 234. A lower end of the elevating shaft 232 is supported and secured on an upper plate portion 234a of the support member 234. A side plate portion 234b of the support member 234 is secured and supported on a nut 236 as an "elevating member" described later. A threaded shaft 235 as a "drive shaft" is threaded in the nut 236.

The threaded shaft 235 is vertically provided in the drive chamber 220. An upper end of the threaded shaft 235 is rotatably supported on a lower surface of the partition plate 201. A lower end of the threaded shaft 235 is coupled to a rotating shaft of the wafer elevating motor mechanism 238 and supported.

The nut 236 moves up along a guiding member 237 by the wafer elevating motor mechanism 238 rotating the threaded shaft 235 in one direction, and moves down along a guiding member 237 by the wafer elevating motor mechanism 238 rotating the threaded shaft 235 in the other direction.

Next, with reference to FIGS. 3, 4, and 6, a structure of the horizontal transfer mechanism 240 will be described.

The horizontal transfer mechanism 240 includes the transfer arm 123, a mechanism for moving the transfer arm 123 up and down, and a mechanism for extending and contracting the transfer arm 123.

As shown in FIG. 6, a slide mechanism 241 includes a guide plate 241a and a slide plate 241b. The guide plate 241a is secured to an upper surface of the partition plate 201. The slide plate 241b is guided by the guide plate 241a and moves up and down. An elevating plate 242 is secured to the slide plate 241b, and the elevating plate 242 is substantially horizontally placed.

Arm elevating bellows 243a, 243b are provided to maintain airtightness between the clean chamber 210 and the drive chamber 220. Upper ends of the arm elevating bellows 243a, 243b are airtightly secured to a lower surface of the elevating plate 242. Lower ends of the arm elevating bellows 243a, 243b are airtightly secured to the upper surface of the partition plate 201 so as to surround outer edges of opening holes 201b, 201c. The arm elevating bellows 243a, 243b expand and contract vertically as the elevating plate 242 moves up and down.

An elevating shaft 244 moves the elevating plate 242 up and down. An upper end of the elevating shaft 244 is pressed into a press-in hole 242a provided in a lower surface of the elevating plate 242. A lower end of the elevating shaft 244 is abutted against and supported on an upper surface of a plate 245d (details will be described later) provided on the arm elevating motor mechanism 245.

The arm elevating motor mechanism 245 includes a motor 245a. When the motor 245a rotates a cam 245b, a rotating plate 245c moves up and down while rotating, and thus the plate 245d moves up and down.

Support tables 246a, 246b have a substantially cylindrical shape, and are placed and secured on an upper surface of the elevating plate 242.

A base plate 700 (details will be described later) of the transfer arm 123 is placed and secured on upper surfaces of the support tables 246a, 246b.

The arm extending motor mechanism 249 rotates the drive shaft 248, and thus extends and contracts the transfer arm 123. The arm extending motor mechanism 249 is secured to the plate 245d that moves up and down. Thus, the arm extending motor mechanism 249 and the drive shaft 248 also move up and down as the plate 245d moves up and down.

Figure 7:
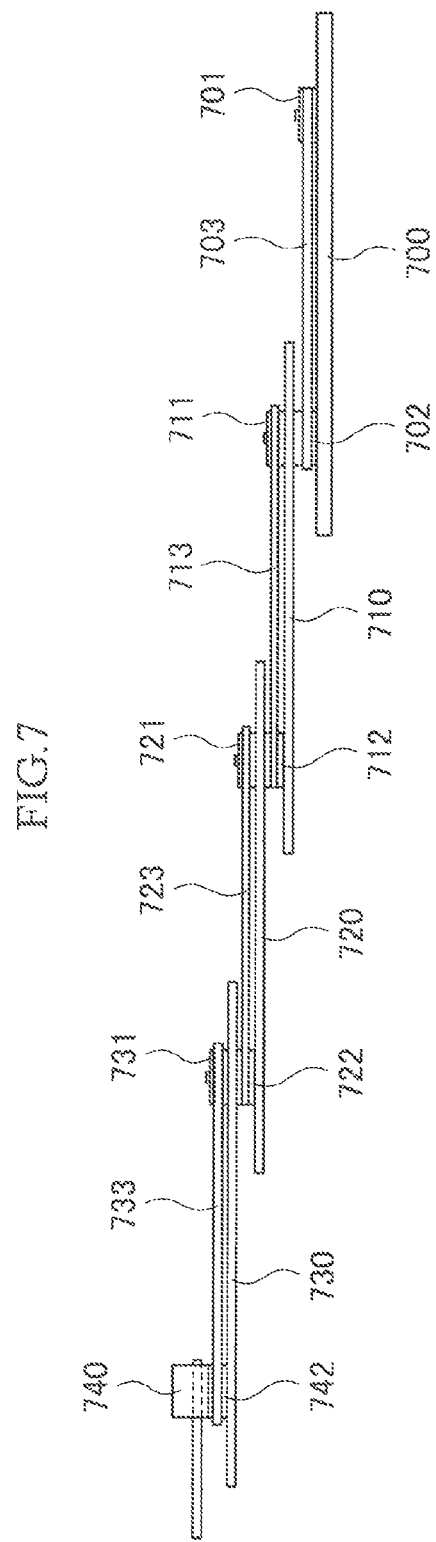
FIG. 7 is a side view of a structure of a transfer arm according to Embodiment 1 of the present invention.
Figure 8:
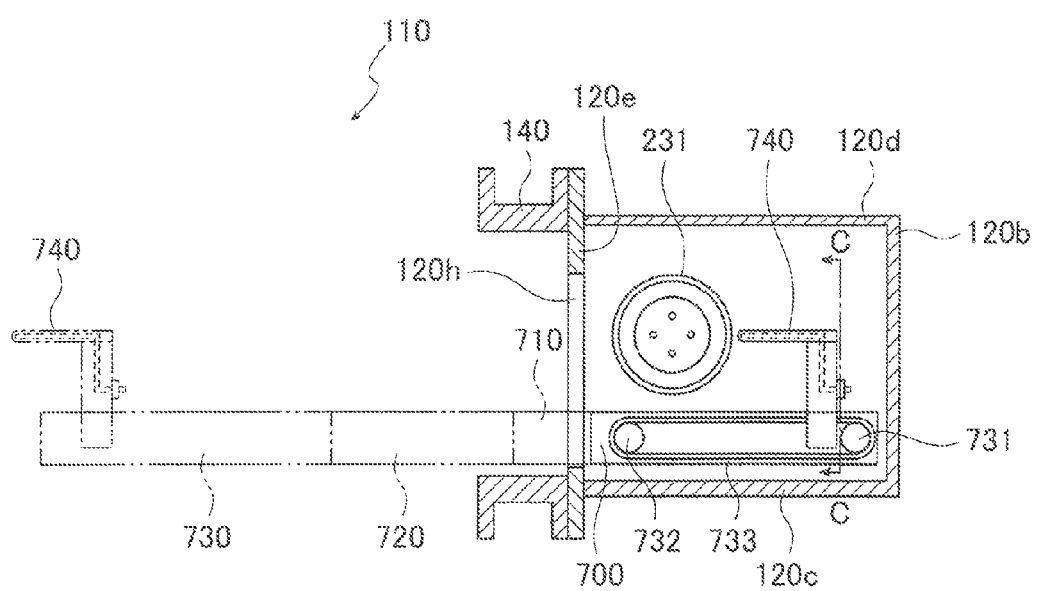
FIG. 8 is a plan view for illustrating the structure of the transfer arm according to Embodiment 1 of the present invention.
Figure 9:
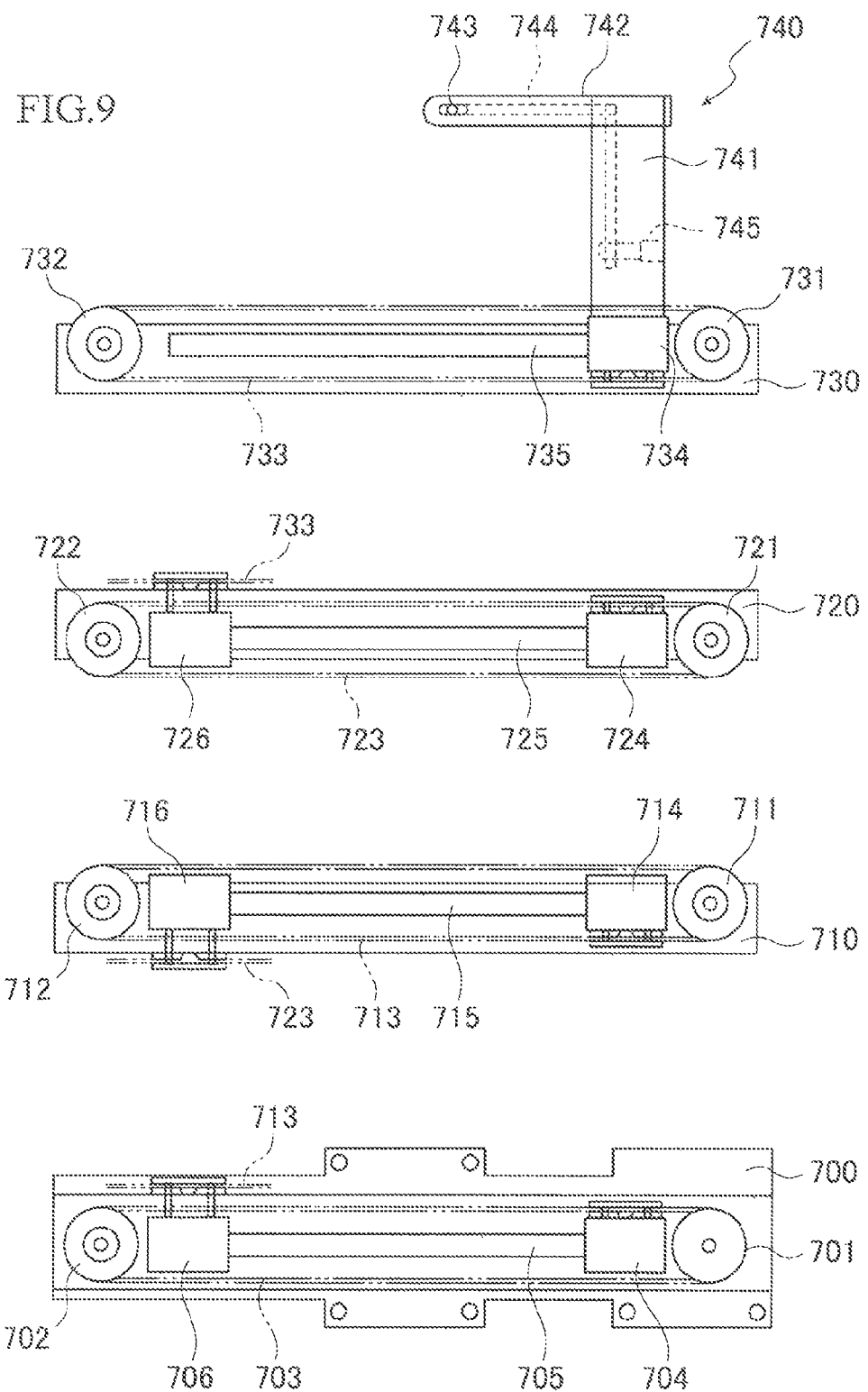
FIG. 9 is an exploded plan view of the transfer arm according to Embodiment 1 of the present invention.
Figure 10:
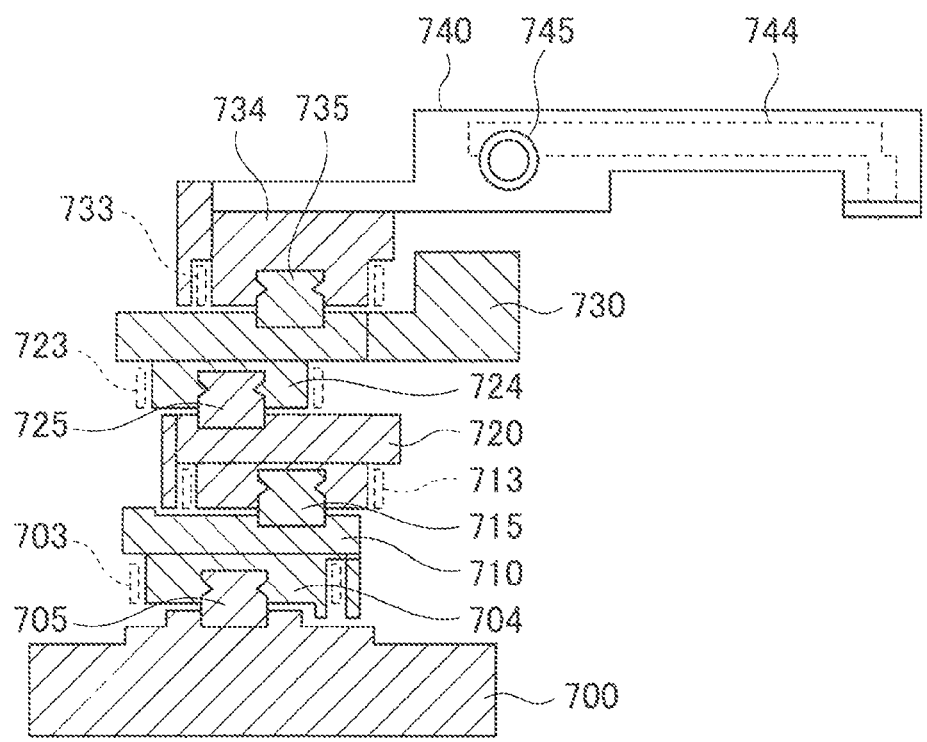
FIG. 10 is a C-C sectional view of FIG. 8 according to Embodiment 1 of the present invention.
Figure 11:
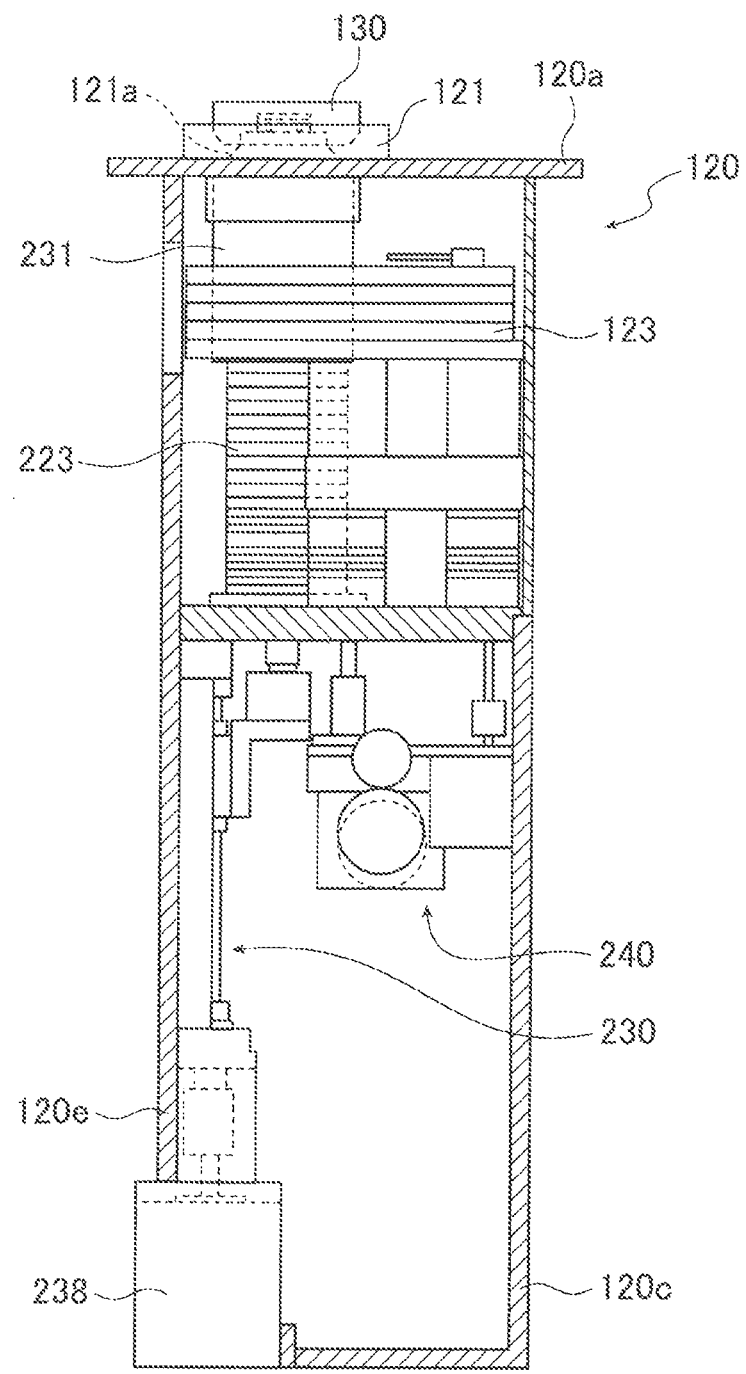
FIG. 11 is a schematic sectional view for illustrating an operation of the compact manufacturing apparatus according to Embodiment 1 of the present invention.

FIGS. 7 to 10 are schematic views of a structure of the transfer arm 123, FIG. 7 is a side view, FIG. 8 is a plan view, FIG. 9 is an exploded plan view, and FIG. 10 is a C-C sectional view of FIG. 8.

As shown in FIGS. 7 to 10, the transfer arm 123 has a structure including a first slide arm 710, a second slide arm 720, a third slide arm 730, and a fourth slide arm 740 vertically stacked on a base plate 700. The transfer arm 123 transfers the semiconductor wafer 131 into the processing chamber 110 through the transfer port 120h in the apparatus antechamber 120 and a coupling portion 140 airtightly coupling the apparatus antechamber 120 and the processing chamber 110 (see FIG. 8).

As shown in FIG. 9, pulleys 701, 702 are provided at opposite ends of the base plate 700. A belt 703 is wound between the pulleys 701, 702. The pulley 701 is coupled to the drive shaft 248 described above (see FIG. 6), and rotates with rotation of the drive shaft 248.

Further, the base plate 700 includes a slide member 704. The slide member 704 is guided by a guide rail 705 to be movable in a longitudinal direction. Further, the slide member 704 holds the belt 703, and is coupled and secured to a bottom surface of the first slide arm 710 provided on an upper stage.

In addition, the base plate 700 includes a transmission member 706. The transmission member 706 is placed behind the pulley 702 (on a right side in FIGS. 7 to 9) and secured to the base plate 700. Then, the transmission member 706 holds a belt 713 of the first slide arm 710 provided on an upper stage. Further, the transmission member 706 abuts against a right side surface of the first slide arm 710 on an upper stage, and guides movement of the first slide arm 710.

Pulleys 711, 712 are rotatably provided at opposite ends of the first slide arm 710, and the belt 713 is wound between the pulleys 711, 712.

Further, the first slide arm 710 includes a slide member 714. The slide member 714 is guided by a guide rail 715 to be movable in a longitudinal direction. Further, the slide member 714 holds the belt 713, and is coupled and secured to a bottom surface of a second slide arm 720 provided on an upper stage.

In addition, the first slide arm 710 includes a transmission member 716. The transmission member 716 is placed behind the pulley 712 (on a right side in FIGS. 7 to 9) and secured to the first slide arm 710. The transmission member 716 holds a belt 723 of the second slide arm 720 provided on an upper stage. Further, the transmission member 716 abuts against a left side surface of the second slide arm 720 on an upper stage, and guides movement of the second slide arm 720.

Pulleys 721, 722 are rotatably provided at opposite ends of the second slide arm 710, and a belt 723 is wound between the pulleys 721, 722, as in the first slide arm described above.

A slide member 724 of the second slide arm 710 is guided by a guide rail 725 to be movable in a longitudinal direction. Further, the slide member 724 holds the belt 723, and is coupled and secured to a bottom surface of a third slide arm 730 provided on an upper stage.

Further, a transmission member 726 of the second slide arm 720 is placed behind the pulley 722 (on a right side in FIGS. 7 to 9) and secured to the second slide arm 720. The transmission member 726 holds a belt 733 of the third slide arm 730 provided on an upper stage. Further, the transmission member 726 abuts against a right side surface of the third slide arm 730, and guides movement of the third slide arm 730.

Pulleys 731, 732 are provided at opposite ends of the third slide arm 730. The pulleys 731, 732 are rotatably provided. A belt 733 is wound between the pulleys 731, 732.

Further, a slide member 734 of the third slide arm 730 is guided by a guide rail 735 to be movable in a longitudinal direction. Also, the slide member 734 holds the belt 733.

A fourth slide arm 740 includes a horizontal plate 741 extending perpendicularly to an extension/contraction direction of the transfer arm 123. The horizontal plate 741 is coupled and secured to the slide member 734 of the third slide arm 730 described above.

Further, the fourth slide arm 740 includes a hand portion 742 that is secured to a front end of the horizontal plate 741 and extends in the extension/contraction direction of the transfer arm 123.

A suction hole 743 for vacuum sucking the semiconductor wafer 131 (not shown in FIGS. 7 to 10) is provided in a front end portion of the hand portion 742. The suction hole 743 is connected through a suction pipe 744 to a suction hole 745 (see FIG. 9). The suction hole 745 is connected through a resin pipe (not shown) to a vacuum pump (not shown).

As shown in FIGS. 4 and 5, the apparatus antechamber 120 includes an air supply valve 251 and an exhaust valve 252.

The air supply valve 251 is provided on the back plate 120*f* (see FIG. 4). The air supply valve 251 introduces clean air or the like from which fine particles are removed by filtering or the like into the air supply passage 120*g* from outside.

An exhaust valve 253 is secured to a lower side of an exhaust port 201*d* (see FIG. 5). An exhaust pipe 257 is coupled to the exhaust valve 253.

Next, the container placement table 121 will be described.

As described above, the wafer transfer container 130 is set on the container placement table 121 (for example, see FIG. 5). Then, the delivery bottom 132 of the wafer transfer container 130, on which the semiconductor wafer 131 is placed, is transferred into the clean chamber 210. As the wafer transfer container 130, for example, a transfer container disclosed in Japanese Patent Application No. 2010-131470 or the like may be used.

When the wafer transfer container 130 is not set, an opening of the container placement table 121 is covered by an upper end of the elevator 231 (not shown).

Next, with reference to FIGS. 11 to 14, an operation of the compact semiconductor manufacturing apparatus according to this embodiment will be described.

As described above, when the wafer transfer container 130 is not set, the elevator 231 moves up to a highest position to cover an inlet 121*a* of the container placement table 121. In this state, the wafer transfer container 130 is set on the container placement table 121 (see FIG. 11). At this time, the delivery bottom 132 (for example, see FIG. 5) of the wafer transfer container 130 is held by the elevator 231, for example, by a suction force or the like of an electromagnet (not shown).

The wafer transfer container 130 is set on the container placement table 121, and then pressed and secured on the container placement table 121 by pressing down the lever 122 (see FIGS. 1 and 2).

Then, the wafer elevating motor mechanism 238 is driven to start rotation of the threaded shaft 235. Thus, the nut 236 moves down, and thus the elevator 231 moves down as the elevating shaft 232 moves down (see FIG. 12). In Embodiment 1, since the wafer elevating bellows 233 seals the clean chamber 210 from the drive chamber 220, an inside of the clean chamber 210 is unlikely to be contaminated even if fine particles are spread by driving the wafer elevating motor mechanism 238 and the threaded shaft 235.

Figure 12:
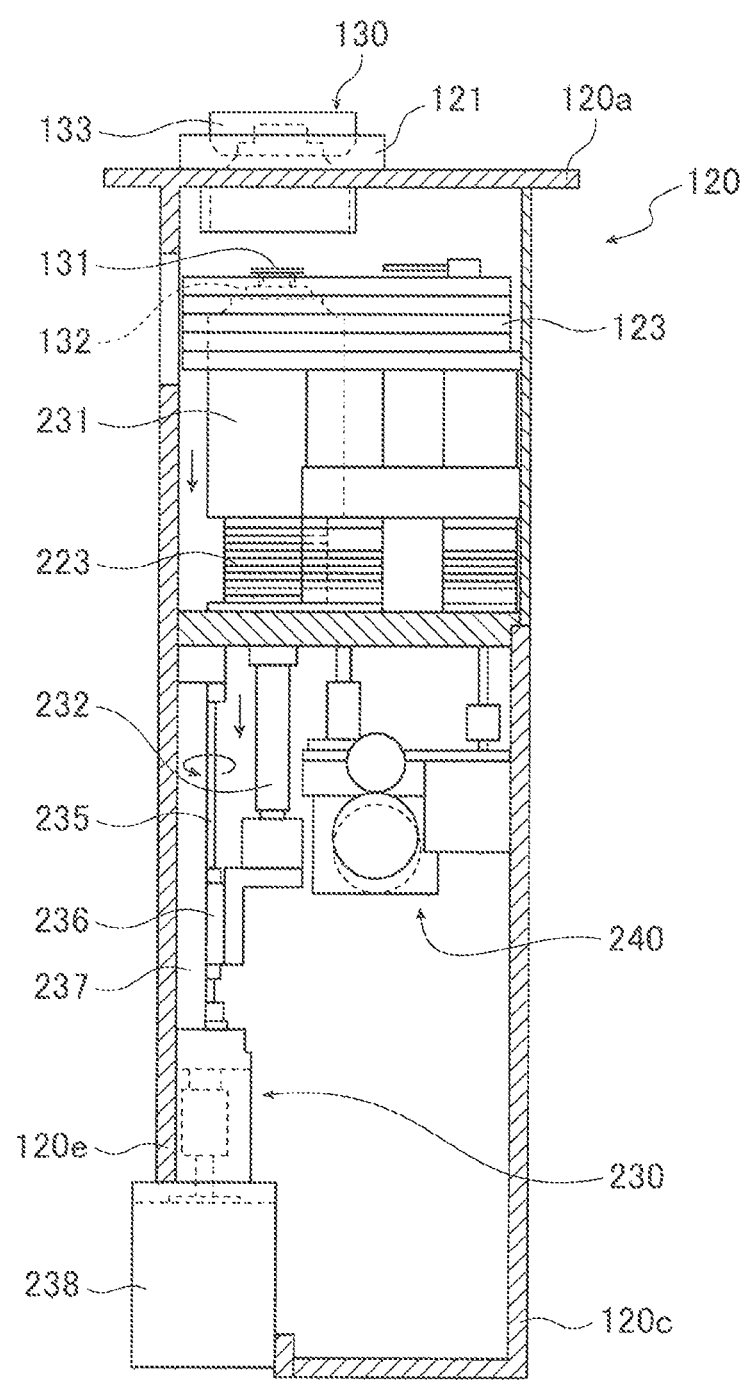
FIG. 12 is a schematic sectional view for illustrating the operation of the compact manufacturing apparatus according to Embodiment 1 of the present invention.
Figure 13:
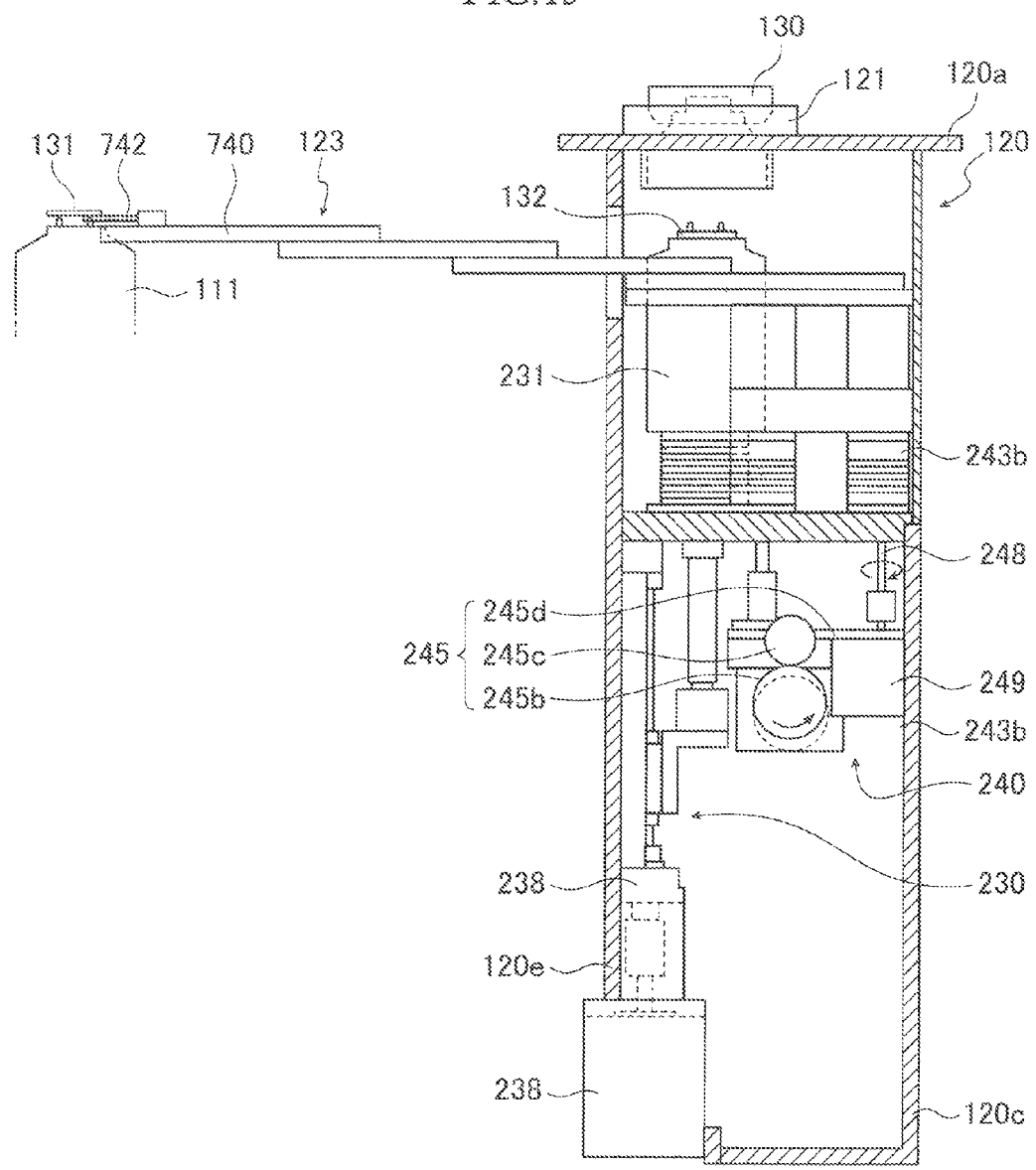
FIG. 13 is a schematic sectional view for illustrating the operation of the compact manufacturing apparatus according to Embodiment 1 of the present invention.
Figure 14:
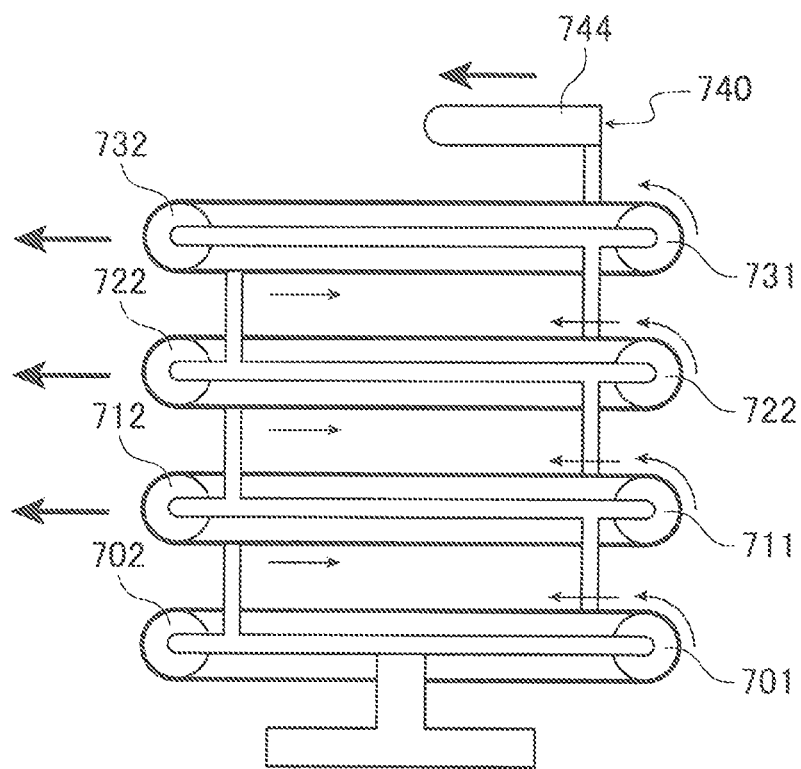
FIG. 14 is a conceptual view for illustrating the operation of the compact manufacturing apparatus according to Embodiment 1 of the present invention.

When the elevator 231 moves down, the delivery bottom 132 of the wafer transfer container 130 moves down while being held by the elevator 231 (see FIG. 12). Thus, the semiconductor wafer 131, while being placed on the delivery bottom 132, is transferred into the apparatus antechamber 120. When the delivery bottom 132 moves down, a lid 133 still covers the container placement table 121. Thus, if the delivery bottom 132 is transferred into the apparatus antechamber 120, fine particles are less likely to enter the apparatus antechamber 120.

When the elevator 231 moves down to a predetermined position and stops, then, the arm extending motor mechanism 249 is driven to rotate the drive shaft 248. Thus, the pulley 701 of the base plate 700 starts rotating (see FIGS. 9 and 14).

When the pulley 701 rotates, the belt 703 rotates. As described above, the slide member 704 holds the belt 703, and is also coupled and secured to a bottom surface of the first slide arm 710. Thus, when the belt 703 rotates, the slide member 704 is guided by the rail 705 and moves in the extending direction (to a left in FIG. 9), and thus the first slide arm 710 also moves in the extending direction.

As described above, the transmission member 706 is secured to the base plate 700, and holds the belt 713 of the first slide arm 710. Thus, when the first slide arm 710 moves in the extending direction, the belt 713 of the first slide arm 710 starts rotating.

When the belt 713 rotates, the slide member 714 of the first slide arm 710 is guided by the rail 715 and moves in the extending direction. Thus, the second slide arm 720 moves relatively to the first slide arm 710 in the extending direction. When the second slide arm 720 relatively moves, the transmission member 716 of the first slide arm 710 rotates the belt 723 of the second slide arm 720.

When the belt 723 rotates, the slide member 724 of the second slide arm 720 is guided by the rail 725 and moves in the extending direction. Thus, the third slide arm 730 moves relatively to the second slide arm 720 in the extending direction. When the third slide arm 730 relatively moves, the transmission member 726 of the second slide arm 720 rotates the belt 733 of the third slide arm 730.

When the belt 733 rotates, the slide member 734 of the third slide arm 730 is guided by the rail 735 and moves in the extending direction. Thus, the fourth slide arm 740 moves relatively to the third slide arm 730 in the extending direction.

As such, the rotation of the drive shaft 248 can extend the transfer arm 123. In Embodiment 1, since the arm elevating bellows 243b seals the clean chamber 210 from the drive chamber 220, an inside of the clean chamber 210 is unlikely to be contaminated even if fine particles are spread by driving the arm extending motor mechanism 249 and the drive shaft 248.

The transfer arm 123 is first extended to a position of the elevator 231, and stops with the front end portion (portion having the suction hole 743) being inserted into a clearance between the semiconductor wafer 131 and the delivery bottom 132. Then, the wafer elevating motor mechanism 238 is further driven to again slightly move the elevator 231 down to place the semiconductor wafer 131 on the suction hole 743 provided in the hand portion 742 (see FIG. 9) of the fourth slide arm 740. Further, air is exhausted from the exhaust hole 745 to vacuum suck the semiconductor wafer 131 on the hand portion 742.

Then, the rotation of the drive shaft 248 is restarted to extend the transfer arm 123 into the processing chamber 110. Then, the semiconductor wafer 131 is transferred onto the wafer placement table 111 in the processing chamber 110 (see FIG. 13).

Then, the rotation of the drive shaft 248 is stopped to stop extension of the transfer arm, and then exhaust of air from the exhaust hole 745 is stopped to stop suction of the semiconductor wafer 131.

Then, the arm elevating motor mechanism 245 is driven to slightly rotate the cam 245b. Thus, the rotating plate 245c moves down and the plate 245d also moves down. Thus, the entire transfer arm 123 and horizontal transfer mechanism 240 slightly move down. As a result, the semiconductor wafer 131 is placed on the wafer placement table 111.

Then, the transfer arm 123 is contracted and returned into the clean chamber 210. Thus, transfer of the semiconductor wafer 131 from the wafer transfer container 130 to the processing chamber 110 is finished. Then, a desired processing of the semiconductor wafer 131 is performed in the processing chamber 110.

The semiconductor wafer 131 is transferred from the inside of the processing chamber 110 to the wafer transfer container 130 by an operation opposite to that described above.

As described above, according to Embodiment 1, the wafer elevating mechanism 230 can be used to transfer the semiconductor wafer 131 from the container placement table 121 provided on the top plate 120a of the apparatus antechamber 120 into the apparatus antechamber 120, and then the horizontal transfer mechanism 240 can be used to transfer the semiconductor wafer 131 in the horizontal direction into the processing chamber 110, which enables the apparatus antechamber 120 to be made more compact.

In Embodiment 1, the processing chamber 110 is separable from the apparatus antechamber 120, which can increase versatility of the apparatus antechamber 120 and reduce manufacturing cost of the compact semiconductor manufacturing apparatus 100.

Further, the transfer arm elevating mechanism is provided, which can move the horizontal transfer mechanism 240 down to place the semiconductor wafer 131 on the wafer placement table 11 in the processing chamber 110.

In Embodiment 1, the semiconductor manufacturing apparatus using the semiconductor wafer has been described as an example. However, the present invention may be applied to a manufacturing apparatus for manufacturing a device from other types of substrates (for example, an insulating substrate such as a sapphire substrate, or a conductive substrate such as an aluminum substrate), or a processing substrate of a non-disk shape (for example, a rectangular shape).

In Embodiment 1, the semiconductor device is taken as an example of the "device". However, the present invention may be applied to a manufacturing apparatus for manufacturing other types of devices (for example, optical devices such as an optical element or an optical integrated circuit).

Further, the present invention may be applied to an apparatus for processing a substrate, and also to an apparatus for performing other steps (for example, a device testing step) in a manufacturing process. The "processing chamber" in the present invention includes a processing chamber performing such other steps.

In this embodiment, the first to fourth slide arms 710 to 740 of the transfer arm 123 are vertically stacked, but a plurality of slide arms may be horizontally stacked, or configured in different manners.

REFERENCE SIGNS LIST 100 compact semiconductor manufacturing apparatus
110 processing chamber
120 apparatus antechamber
121 container placement table
123 transfer arm
130 wafer transfer container
131 semiconductor wafer
132 delivery bottom
133 lid
201 partition plate
210 clean chamber
220 drive chamber
230 wafer elevating mechanism
231 elevator
231a placement portion 231b protrusion
232 elevating shaft
233 wafer elevating bellows
234 support member
235 threaded shaft
236 nut
237 guiding member
238 wafer elevating motor mechanism
240 horizontal transfer mechanism
241 slide mechanism
242 elevating plate
243a, 243b arm elevating bellows
244 elevating shaft
245 arm elevating motor mechanism
246a, 246b support table
248 drive shaft
249 arm extending motor mechanism
251 air supply valve
252 exhaust valve
253 exhaust pipe
700 base plate
701, 702, 711, 712, 721, 722, 731, 732 pulley
703, 713, 723, 733 belt
704, 714, 724, 734 slide member
705, 715, 725, 735 guide rail
706, 716, 726, 736 transmission member
710 first slide arm
720 second slide arm
730 third slide arm
740 fourth slide arm

The invention claimed is:

1. A substrate transfer antechamber mechanism for a manufacturing apparatus including a processing chamber that performs processing of a processing substrate, and an apparatus antechamber that transfers the processing substrate into and out of the processing chamber, the mechanism comprising:
   a container placement table provided on an upper surface of a casing of the apparatus antechamber onto which a substrate transfer container is detachably settable from an outside of the casing, the substrate transfer container having a delivery bottom onto which the processing substrate is disposed on;
   an inlet provided to the casing of the apparatus antechamber, through which the delivery bottom of the substrate transfer container set on the container placement table is transferred into the apparatus antechamber;
   a substrate elevating mechanism provided in the apparatus antechamber, which moves down while being held from below the delivery bottom of the substrate transfer container, on which the processing substrate remains placed, to transfer the processing substrate into the apparatus antechamber through the inlet; and
   a horizontal transfer mechanism provided in the apparatus antechamber to transfer the processing substrate into the processing chamber using a transfer arm that receives the processing substrate from the delivery bottom and extends in a horizontal direction, wherein a base of the transfer arm is disposed inside the casing of the apparatus antechamber.

2. The substrate transfer antechamber mechanism according to claim 1, wherein the processing chamber is separable from the apparatus antechamber.

3. The substrate transfer antechamber mechanism according to claim 1, further comprising a transfer arm elevating mechanism provided in the apparatus antechamber to move the horizontal transfer mechanism down to place the processing substrate on a substrate placement table in the processing chamber.

4. The substrate transfer antechamber mechanism according to claim 1, wherein the processing substrate is a wafer having a diameter of 20 millimeters or less.

5. The substrate transfer antechamber mechanism according to claim 1, wherein after the substrate elevating mechanism moves down the delivery bottom of the substrate transfer container into the apparatus antechamber, the substrate transfer antechamber mechanism operates:
   a first horizontal rectilinear motion to insert a hand portion of the transfer arm to a clearance under a bottom surface of the processing substrate placed on the delivery bottom,
   a first vertical rectilinear motion to hold the processing substrate by the hand portion by contacting the hand portion to the bottom surface of the processing substrate and separating the processing substrate from the delivery bottom, after the first horizontal rectilinear motion,
   a second horizontal rectilinear motion to transfer the processing substrate from the apparatus antechamber into the processing chamber by extending the transfer arm without rotating, after the first vertical rectilinear motion, and
   a second vertical rectilinear motion to place the processing substrate onto a substrate placement table in the processing chamber, after the second horizontal rectilinear motion.

6. The substrate transfer antechamber mechanism according to claim 1, wherein;
   the substrate transfer container is configured so as to house one processing substrate,
   the processing chamber is configured so as to process one processing substrate per one processing, and
   the delivery bottom of the substrate transfer container and a substrate placement table of the processing chamber is allocated so that a translation of the processing substrate between above the delivery bottom and above the substrate placement table is executed by reciprocation of the transfer arm.

7. The substrate transfer antechamber mechanism according to claim 1, wherein;
   the transfer arm of the horizontal transfer mechanism comprises plurality of slide arms stacked on each other, and
   the plurality of slide arms move relatively to extend the transfer arm.

* * * * *

UNITED STATES PATENT AND TRADEMARK OFFICE
CERTIFICATE OF CORRECTION

| | |
|---|---|
| PATENT NO. | : 9,524,895 B2 |
| APPLICATION NO. | : 14/647685 |
| DATED | : December 20, 2016 |
| INVENTOR(S) | : Shiro Hara et al. |

It is certified that error appears in the above-identified patent and that said Letters Patent is hereby corrected as shown below:

In the Claims

Column 12, Line 40:
In Claim 6, delete "wherein;" and insert -- wherein --, therefore.

Column 12, Line 52:
In Claim 7, delete "wherein;" and insert -- wherein --, therefore.

Signed and Sealed this
Twenty-ninth Day of May, 2018

Andrei Iancu
*Director of the United States Patent and Trademark Office*